United States Patent
Cai et al.

(10) Patent No.: US 7,479,418 B2
(45) Date of Patent: Jan. 20, 2009

(54) METHODS OF APPLYING SUBSTRATE BIAS TO SOI CMOS CIRCUITS

(75) Inventors: Jin Cai, Mohegan Lake, NY (US); Wilfried E. Haensch, Somers, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/329,643

(22) Filed: Jan. 11, 2006

(65) Prior Publication Data

US 2007/0158747 A1 Jul. 12, 2007

(51) Int. Cl.
*H01L 21/00* (2006.01)
(52) U.S. Cl. ................ 438/154; 438/217; 257/E21.415
(58) Field of Classification Search ................ 438/153, 438/199, 217, 289, 290, 218, 154; 257/E21.415, 257/351
See application file for complete search history.

(56) References Cited

U.S. PATENT DOCUMENTS

| 5,164,805 | A | * | 11/1992 | Lee | 257/351 |
| 5,686,340 | A | * | 11/1997 | Segawa et al. | 438/232 |
| 6,060,748 | A | * | 5/2000 | Uchida et al. | 257/347 |
| 7,115,950 | B2 | * | 10/2006 | Tokushige | 257/351 |
| 2002/0008559 | A1 | * | 1/2002 | Krishnamurthy et al. | 327/206 |
| 2002/0185681 | A1 | | 12/2002 | Nakano et al. | |
| 2003/0008464 | A1 | * | 1/2003 | Oh et al. | 438/289 |
| 2003/0197547 | A1 | * | 10/2003 | Mizuno et al. | 327/534 |
| 2004/0046207 | A1 | | 3/2004 | Dennard et al. | |
| 2005/0048703 | A1 | | 3/2005 | Dennard et al. | |

OTHER PUBLICATIONS

Ieong, Meikei, et al., "Experimental Evaluation of Carrier Transport and Device Design for Planar Symmetric/Asymmetric Double-Gate/Ground-plane CMOSFETs." IEEE Electron Devices Society (2001).

* cited by examiner

*Primary Examiner*—Tuan N. Quach
(74) *Attorney, Agent, or Firm*—Scully, Scott, Murphy & Presser, P.C.; Robert M. Trepp, Esq.

(57) ABSTRACT

The present invention relates to methods for reducing the threshold voltage difference between an n-type field effect transistor (n-FET) and a p-type field effect transistor (p-FET) in a complementary metal-oxide-semiconductor (CMOS) circuit located on a silicon-on-insulator (SOI) substrate. Specifically, a substrate bias voltage is applied to the CMOS circuit for differentially adjusting the threshold voltages of the n-FET and the p-FET. For example, a positive substrate bias voltage can be used to reduce the threshold voltage of the n-FET but increase that of the p-FET, while a negative substrate bias voltage can be used to increase the threshold voltage of the n-FET but reduce that of the p-FET. Further, two or more substrate bias voltages of different magnitudes and/or directions can be used for differentially adjusting the n-FET and p-FET threshold voltages in two or more different CMOS circuits or groups of CMOS circuits.

5 Claims, 4 Drawing Sheets

METHODS OF APPLYING SUBSTRATE BIAS TO SOI CMOS CIRCUITS

FIELD OF THE INVENTION

The present invention relates to methods and devices for reducing the threshold voltage difference between n-type field effect transistors (n-FETs) and p-type field effect transistors (p-FETs) in complementary metal-oxide-semiconductor (CMOS) circuits fabricated on semiconductor-on-insulator (SOI) substrates.

BACKGROUND OF THE INVENTION

In CMOS circuits, it is desirable to tune the threshold voltages of the n-FET devices and the p-FET devices to achieve substantially the same magnitude, which provides a balance between the n-FET and p-FET drive currents and, in turn, leads to improved device performance and circuit speed.

However, actual n-FET and p-FET threshold voltages in a CMOS circuit can be different due to various reasons. For example, if the n-FETs and the p-FETs contain metal or metal silicide gate electrodes, their threshold voltages will be significantly different, because the work function of metal or metal silicide is asymmetric with respect to the n-FETs and p-FETs. Although differentially doped polysilicon electrodes can be used in place of metal or metal silicide electrodes to reduce the threshold voltage differential between n-FETs and p-FETs, the process variations for n-FETs and p-FETs may affect the threshold voltages of the n-FETs and p-FETs differently, therefore still resulting in a certain degree of threshold voltage imbalance therebetween. Further, depending on specific transistor designs, the threshold voltages of n-FETs and p-FETs may have different temperature sensitivities. Thus, even if the threshold voltages are balanced at room temperature, imbalance may be generated subsequently during operation, because the operating temperature of the integrated circuit (IC) chip is typically 60-80 degrees higher than room temperature.

There is therefore a need for dynamic, post-fabrication adjustment of the threshold voltages of the n-FETs and p-FETs in a CMOS circuit in order to reduce the threshold voltage difference therebetween or more preferably, to achieve a substantial threshold voltage balance.

SUMMARY OF THE INVENTION

The present invention employs a substrate bias voltage to reduce the threshold voltage difference between n-FETs and p-FETs in a CMOS circuit, based on the differential impacts of the substrate bias voltage on the threshold voltages of the n-FETs and p-FETs.

In one aspect, the present invention relates to a method that comprises:
  a. fabricating at least one CMOS circuit on a semiconductor-on-insulator (SOI) substrate, wherein the at least one CMOS circuit comprises at least one n-FET and at least one p-FET;
  b. applying a substrate bias voltage to the at least one CMOS circuit so as to reduce the difference between the threshold voltage of the at least one n-FET and the threshold voltage of the at least one p-FET by at least 5%.

The term "substrate bias voltage" as used herein refers to the difference between the voltage applied to the semiconductor substrate on which a CMOS circuit is located and the voltage applied to the source region of at least one n-FET device in the CMOS circuit.

Preferably, the substrate bias voltage applied to the CMOS circuit functions to reduce the threshold voltage difference between the n-FET and the p-FET by at least 20%, more preferably by at least 50%, and most preferably by at least 95%.

The gate electrodes of the at least one n-FET and the at least one p-FET in the CMOS circuit may comprise either doped polysilicon or metallic materials. In one specific embodiment of the present invention, both the at least one n-FET and the at least one p-FET in the CMOS circuit comprise metallic gate electrodes. In an alternative embodiment of the present invention, the at least one n-FET comprises an n-doped polysilicon gate electrode, and the at least one p-FET comprises a p-doped polysilicon gate electrode. In a still further alternative embodiment of the present invention, one of the at least one n-FET and the at least one p-FET comprises a doped polysilicon gate electrode, and the other comprises a metallic gate electrode.

The term "metallic" as used herein refers to a structure or component that is formed essentially of a conductive material containing at least one metal in an elemental form, an alloy form, or a compound form. Examples of such conductive material include, but are not limited to: elemental metals, metal alloys, metal nitrides, metal silicides, etc.

In another aspect, the present invention relates to a semiconductor device comprising:
  a. at least one CMOS circuit located on a SOI substrate, wherein said at least one CMOS circuit comprises at least one n-FET and at least one p-FET, and
  b. at least one voltage applicator for applying a substrate bias voltage to the at least one CMOS circuit so as to reduce the difference between the threshold voltage of the at least one n-FET and the threshold voltage of the at least one p-FET by at least 5%.

Other aspects, features and advantages of the invention will be more fully apparent from the ensuing disclosure and appended claims.

DETAILED DESCRIPTION OF THE INVENTION, AND PREFERRED EMBODIMENTS THEREOF

Figure 1:
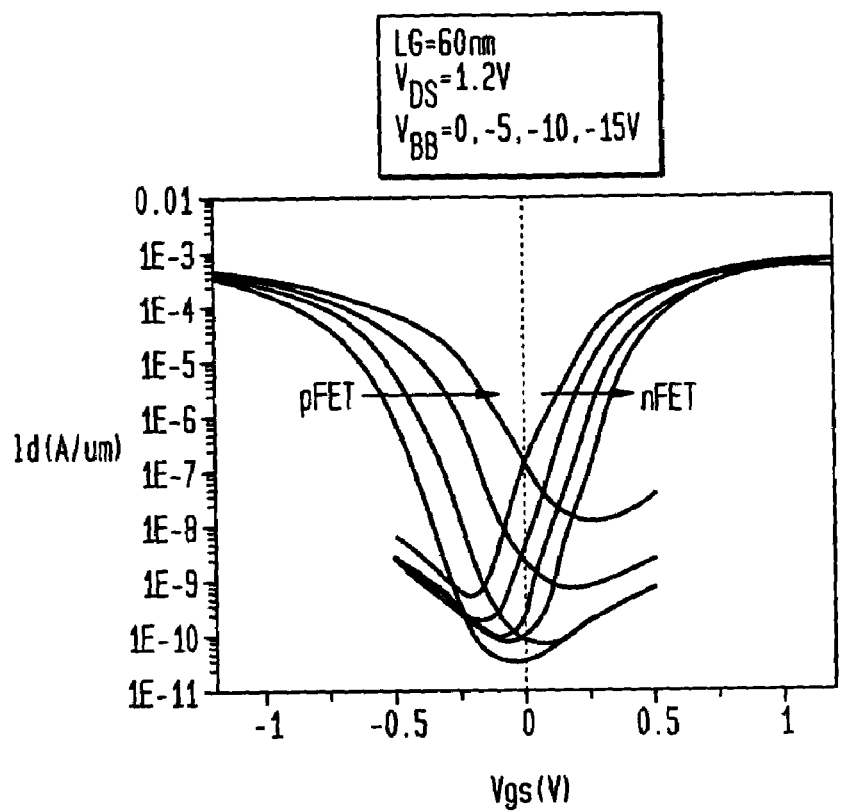
FIG. 1 shows the channel current (Id) response curves for an n-FET device and a p-FET device, which are plotted as a function of the gate voltages (Vgs) at different substrate bias voltages.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

This invention uses a substrate bias voltage to reduce the threshold voltage difference between n-FETs and p-FETs contained in a CMOS circuit or a group of CMOS circuits fabricated on SOI substrates and to improve the performance of the CMOS circuit(s).

It has been discovered by the inventors of the present invention that substrate bias voltages have drastically different impact on the n-FET and p-FET devices. Specifically, a positive substrate bias voltage will decrease the n-FET threshold voltage but increase the p-FET threshold voltage, and a negative substrate bias voltage, on the other hand, will increase the n-FET threshold voltage but decrease the p-FET threshold voltage. Therefore, suitable substrate bias voltages can be applied to the CMOS circuits to reduce the threshold voltage differences between the n-FET and the p-FET devices. Since the source and drain regions of the n-FET and p-FET devices fabricated on a SOI substrate are well insulated from the base substrate layer by the intermediate insulator layer, applying a bias voltage to the base substrate layer will not have any deleterious impact on the device operation and performance.

Note that for CMOS circuits formed in bulk substrates, a p-n junction, instead of an intermediate insulator layer, is used for device isolation. For example, if the bulk substrate is doped with a p-type dopant species, the n-FET device can be directly fabricated in this p-substrate, but the pFET needs to be fabricated in an n-type well formed in the p-substrate. In this manner, the true "device substrate" for the p-FET is n-type, while the true "device substrate" for the n-FET is p-type. Application of a common substrate bias voltage to both the n-FET device substrate and the p-FET device substrate will inevitably result in an undesired forward bias in the p-n junction formed between the source/drain regions of one of the FETs (either p-type or n-type) and its associated device substrate. Therefore, use of SOI substrates instead of bulk substrates is more preferred in practicing the present invention.

The specific impact of the substrate bias voltages on the threshold voltages of the n-FET and p-FET devices in a SOI-CMOS circuit depends on the specific device design. For example, such an impact is relatively small for partially depleted n-FET and p-FET devices, but relatively large for fully depleted n-FET and p-FET device SOI-CMOS. Moreover, the thinner the intermediate insulating layer, the larger the impact of such substrate bias voltages.

FIG. 1 shows the channel current (Id) response curves of a fully depleted n-FET device and a fully depleted p-FET device in a SOI-CMOS circuit, plotted as a function of the gate voltages (Vgs) at different substrate bias voltages. Specifically, the n-FET and p-FET devices both contained metallic electrodes or gates, with a gate length (LG) of about 60 nm and a drain voltage ($V_{DS}$) of about 1.2 V. Different substrate bias voltages ($V_{BB}$) of 0 V, −5 V, −10 V, and −15 V were in turn applied to the SOI-CMOS circuit, and the corresponding Id response curves of the n-FET and the p-FET were plotted.

Figure 2:
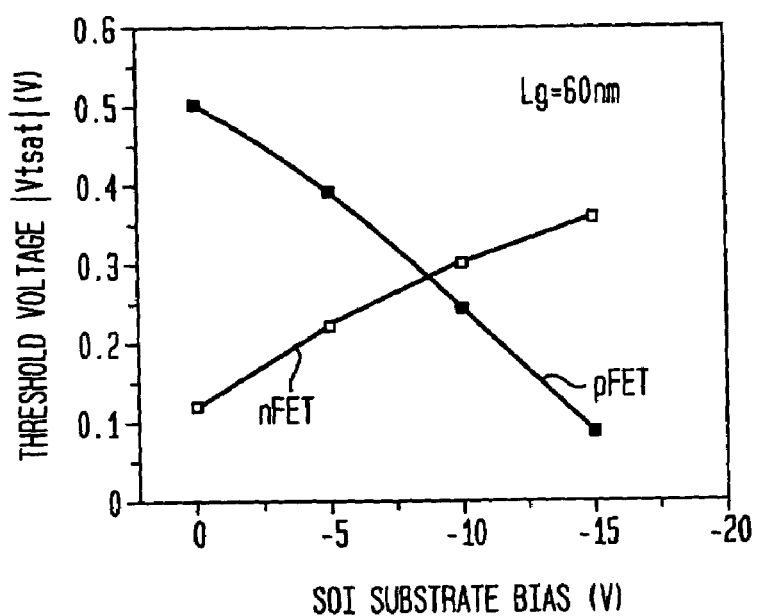
FIG. 2 shows the threshold voltage shifts exhibited by the n-FET device and the p-FET device at different substrate bias voltages.

FIG. 2 shows the threshold voltage shifts exhibited by the above-described fully depleted n-FET and p-FET devices when the substrate bias voltages changed from 0 V to −5 V, −10 V, and −15 V. It is clear that when the substrate bias voltage is 0 V, the threshold voltage of the n-FET is about 400 mV smaller than that of the p-FET, because the metallic electrodes used therein had a work function closer to that of an n-type polysilicon than that of a p-type polysilicon. As mentioned hereinabove, a negative substrate bias voltage can be used to reduce the threshold voltage of the p-FET and to increase the threshold voltage of the n-FET. FIG. 2 shows that a substantial threshold voltage balance between the n-FET and the p-FET was achieved at a substrate bias voltage of approximately −9 V.

As mentioned hereinabove, the thinner the intermediate insulating layer used in the SOI substrate, the larger an impact of the substrate bias voltage has over the n-FET and p-FET threshold voltages. The CMOS circuit as described hereinabove was fabricated in an SOI substrate that contained a buried insulator layer of about 140 nm thick, and a substrate bias voltage of approximately −9V is sufficient to achieve threshold voltage balance between the n-FET and the p-FET. If a thinner buried insulator layer was used, a proportionally smaller substrate bias voltage could be used to achieve the threshold voltage balance. Typically, for a SOI substrate having a buried insulator layer of about 20 nm thick, a substrate bias voltage ranging from more than 0 V to about ±3 V is sufficient for achieving the threshold voltage balance between a fully depleted n-FET and a fully depleted p-FET; for a SOI substrate having a buried insulator layer of about 100 nm thick, a substrate bias voltage ranging from about 0 V to about ±15 V may be necessary for achieving the desired threshold voltage balance.

Further, it has been discovered by the inventors that substrate bias voltages not only affect the threshold voltages of the n-FET and p-FET devices in a CMOS circuit, but also improve the overall performance of such a CMOS circuit, by enhancing the operation speed and reducing the stand-by current of such a CMOS circuit.

Figure 3:
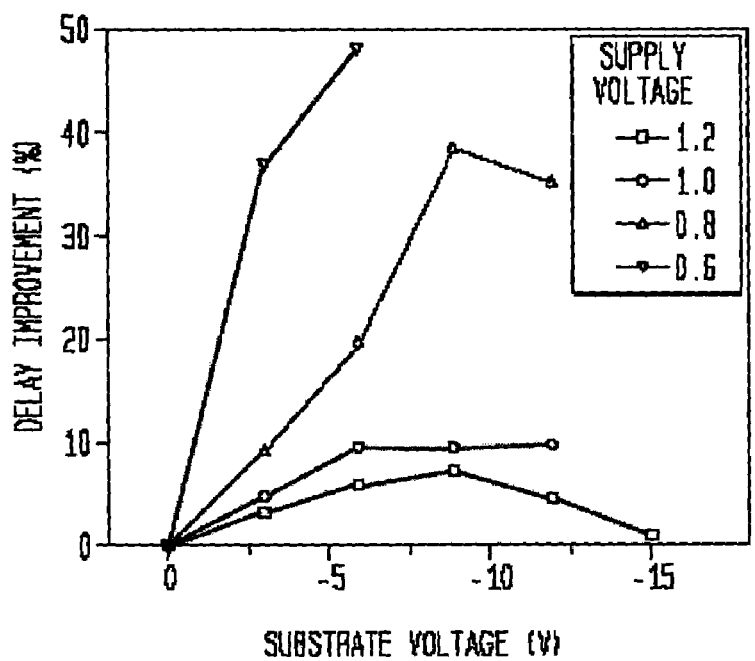
FIG. 3 shows the ring oscillator speed enhancement (or delay improvement) plotted for a CMOS circuit as a function of substrate bias voltages at different power supply voltages.
Figure 4:
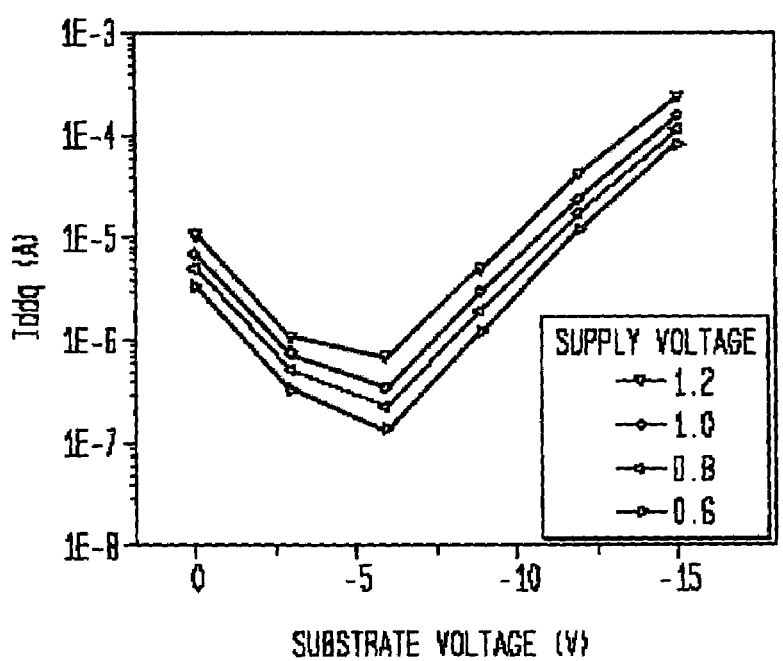
FIG. 4 shows the ring oscillator stand-by current (Iddq) plotted for the CMOS circuit as a function of substrate bias voltages at different power supply voltages.

Specifically, a 65-stage CMOS ring oscillator was used for determining the performance improvements effectuated by application of a substrate bias voltage. The relative speed enhancements or delay improvements per stage were plotted for the ring oscillator as a function of substrate bias voltages at different power supply voltages, as shown in FIG. 3. Peak speed enhancement or delay improvement is achieved by application of a substrate bias voltage of about −9 V, and the overall speed enhancements or delay improvements are more significant at lower power supply voltages. Further, the stand-by currents were also plotted for the ring oscillator as a function of substrate bias voltages at different power supply voltages, as shown in FIG. 4. Significant reduction of stand-by currents is observed for substrate bias voltages ranging from about −1 V to about −9 V, regardless of the power supply voltages.

This experiment confirms the effectiveness of SOI substrate bias voltage in simultaneously maximizing the operation speed of a CMOS circuit and minimizing the stand-by power consumption of such a CMOS circuit.

The implementation of the present invention in a single SOI-CMOS circuit is relatively straightforward. In conventional SOI-CMOS circuit, the substrate is either floating or grounded. In the present invention, instead of floating or grounding the substrate, a direct current (DC) voltage is applied to the substrate. The direction of the applied DC voltage depends on what type of threshold voltage imbalance exists between the n-FET and the p-FET devices. If the threshold voltage of the n-FET is larger than that of the p-FET, a positive substrate bias voltage should be applied. If the threshold voltage of the n-FET is smaller than that of the p-FET, a negative substrate bias voltage should be applied.

Further, either a common substrate bias voltage or two or more substrate voltage biases of different directions and/or magnitudes can be applied to two or more CMOS circuits fabricated on a SOI substrate to reduce the threshold voltage difference, or more preferably to achieve threshold voltage balance, between n-FET and p-FET devices in each of the CMOS circuits. SOI-CMOS structures that each comprise two or more CMOS circuits of the present invention with either a common substrate bias voltage or two or more substrate voltage biases of different directions and/or magnitudes applied thereto will now be described in greater detail by referring to FIGS. 5-8. Note that in these drawings, which are not drawn to scale, like and/or corresponding elements are referred to by like reference numerals. It is further noted that in the drawings only two CMOS circuits that each comprises one n-FET and one p-FET is shown on a SOI semiconductor substrate. Although illustration is made to such an embodiment, the present invention is not limited to the formation of any specific number of CMOS circuits, n-FETs, and p-FETs on the semiconductor substrate.

Figure 5:
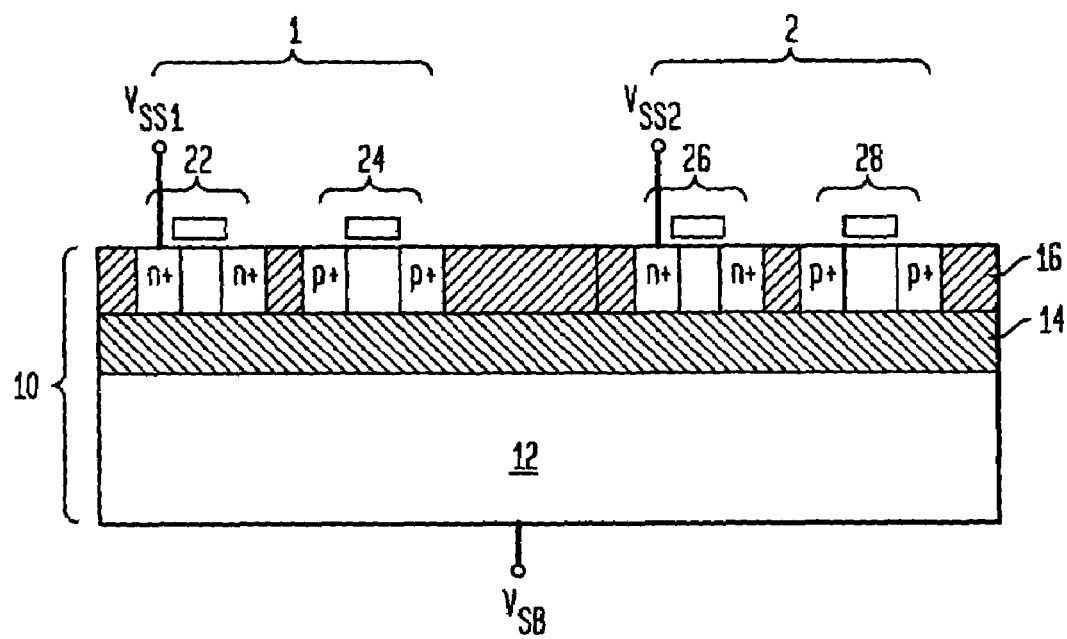
FIG. 5 shows an exemplary semiconductor device comprising two CMOS circuits located in a SOI substrate, while a common substrate bias voltage is applied to a base substrate layer of the SOI substrate, according to one embodiment of the present invention.

Reference is first made to FIG. 5, which shows an SOI substrate 10 that comprises, from the bottom to top, a base semiconductor layer 12, an insulator layer 14, and a semiconductor device layer 16. At least two CMOS circuits 1 and 2 are fabricated on the semiconductor device layer 16. Specifically, the CMOS circuit 1 includes at least one n-FET 22 and at least one p-FET 24, and the CMOS circuit 2 includes at least one n-FET 26 and at least one p-FET 28. The threshold voltage imbalance in the CMOS circuit 1 is the same as that in the CMOS circuit 2. Therefore, a common substrate bias voltage ($V_{BB}$) can be applied by a voltage applicator (not shown) to the base substrate layer 12 for adjusting the threshold voltages of all four FETs 22, 24, 26, and 28, so as to reduce the threshold voltage difference, or more preferably to achieve a threshold voltage balance, between FETs 22 and 24 in the CMOS circuit 1 as well as between FETs 26 and 28 in the CMOS circuit 2. The n-source voltages (Vss1 and Vss2) for both circuits 1 and 2 are preferably maintained at 0 V. The base substrate layer 12 is preferably doped with either an n-type or a p-type dopant species. The $V_{BB}$ can be either positive or negative, depending on whether the n-FET threshold voltage is larger or smaller than the p-FET threshold voltage.

In the event that the threshold voltage imbalance in the CMOS circuit 1 is different from that in the CMOS circuit 2, substrate bias voltages of different magnitudes or even different directions may need to be applied to the CMOS circuits, which requires sufficient isolation between the respective device substrates for CMOS circuits 1 and 2.

For example, if the n-FETs 22 and 26 both have threshold voltages larger than those of the p-FETs 24 and 28 but by different amounts, positive substrate bias voltages of different magnitudes need to be applied to the CMOS circuits 1 and 2. In this event, n-type wells can be fabricated in a base substrate layer doped with a p-type dopant species to provide the required substrate isolation while allowing application of the positive substrate bias voltages.

Figure 6:
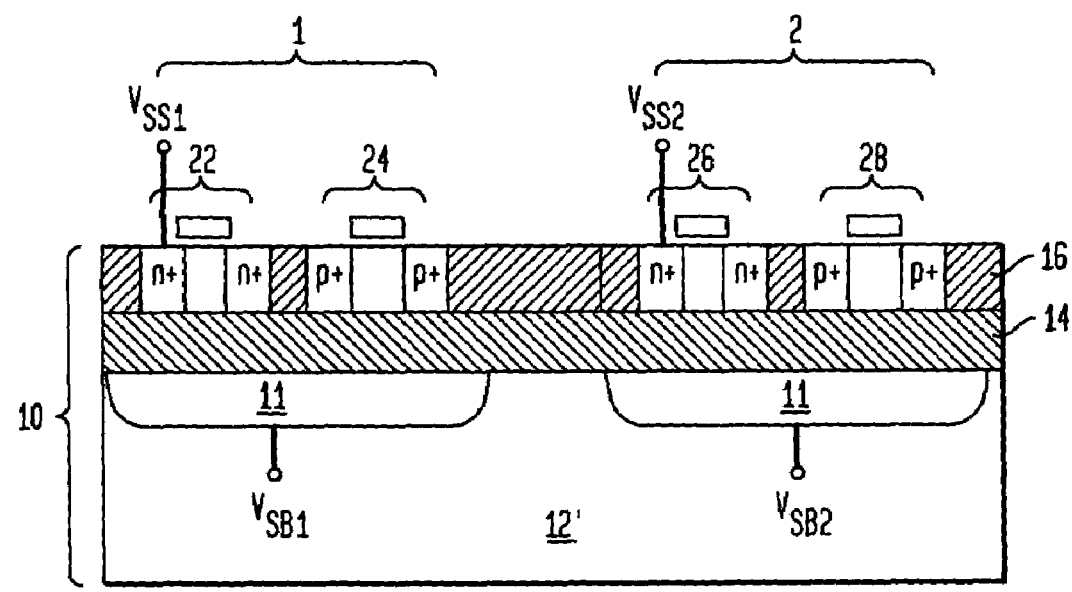
FIG. 6 shows an exemplary semiconductor device comprising two CMOS circuits located in a SOI substrate and over two n-type wells in a p-doped base substrate layer, while two positive bias voltages of different magnitudes are applied to the two n-type wells, according to one embodiment of the present invention.

FIG. 6 shows two n-type wells 11, which are fabricated in a p-doped base semiconductor layer 12' and function as respective device substrates for CMOS circuits 1 and 2. A first substrate bias voltage ($V_{SB1}>0$) of a first magnitude is applied by a first voltage applicator (not shown) to the n-type well 11 that is located under CMOS circuit 1 and functions as the device substrate therefor. A second substrate bias voltage ($V_{SB2}>0$) of a second, different magnitude is applied by a second voltage application (not shown) to the n-type well 11 that is located under CMOS circuit 2 and functions as the device substrate therefor. The positive substrate bias voltages apply desired reverse biases, instead of forward biases, to the diodes formed between the n-type wells 11 and the p-doped base semiconductor layer 12', thereby eliminating any significant current flow and power consumption in the SOI substrate 10.

For another example, if the n-FETs 22 and 26 both have threshold voltages smaller than those of the p-FETs 24 and 28 but by different amounts, negative substrate bias voltages of different magnitudes need to be applied to the CMOS circuits 1 and 2. In this event, p-type wells can be fabricated in a base substrate layer doped with an n-type dopant species to provide the required substrate isolation while allowing application of the negative substrate bias voltages.

Figure 7:
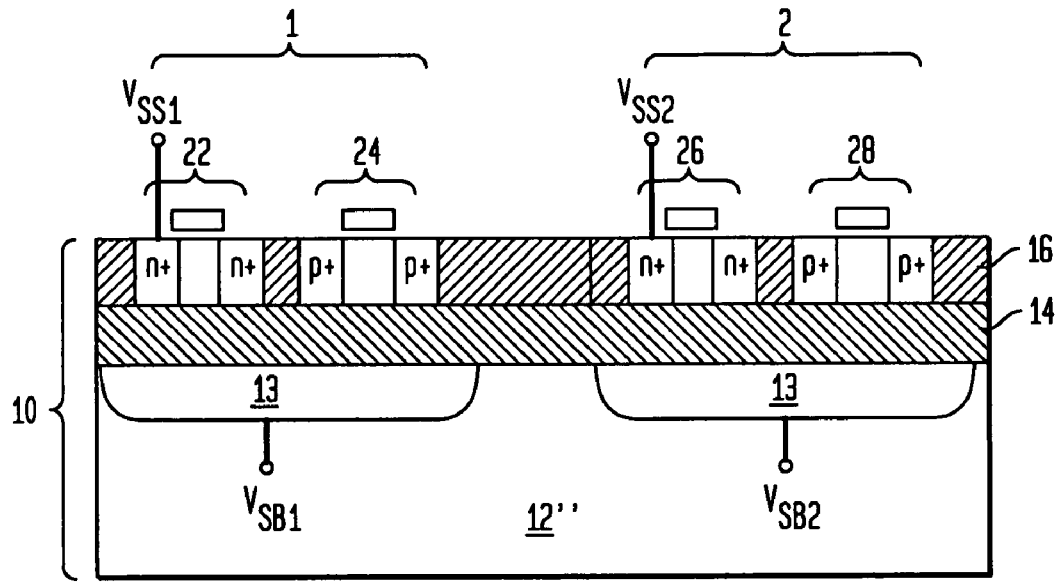
FIG. 7 shows an exemplary semiconductor device comprising two CMOS circuits located in a SOI substrate and over two p-type wells in an n-doped base substrate layer, while two negative bias voltages of different magnitudes are applied to the two p-type wells, according to one embodiment of the present invention.

FIG. 7 shows two p-type wells 13, which are fabricated in an n-doped base semiconductor layer 12" and function as respective device substrates for CMOS circuits 1 and 2. A first substrate bias voltage ($V_{SB1}<0$) of a first magnitude is applied by a first voltage applicator (not shown) to the p-type well 13 that is located under CMOS circuit 1 and functions as the device substrate therefor. A second substrate bias voltage ($V_{SB2}<0$) of a second, different magnitude is applied by a second voltage applicator (not shown) to the p-type well 13 that is located under CMOS circuit 2 and functions as the device substrate therefor. The negative substrate bias voltages apply desired reverse biases, instead of forward biases, to the diodes formed between the p-type wells 13 and the n-doped base semiconductor layer 12", thereby eliminating any significant current flow and power consumption in the SOI substrate 10.

If one of the n-FETs 22 and 26 has a threshold voltage larger than its corresponding p-FET (24 or 28), while the other has a threshold voltage smaller than its corresponding p-FET, substrate bias voltages of different directions may need to be applied to CMOS circuits 1 and 2. In this event, completely isolated device substrates have to be provided for CMOS circuits 1 and 2.

Figure 8:
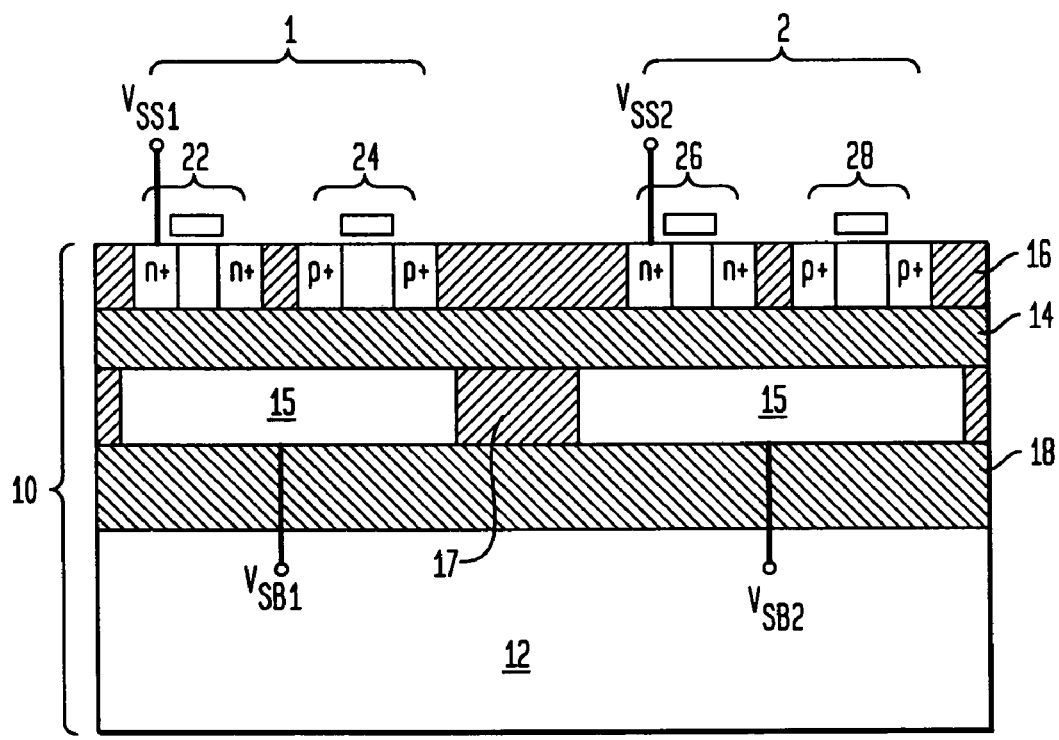
FIG. 8 shows an exemplary semiconductor device comprising two CMOS circuits located over two electrically isolated substrate regions in a SOI substrate, while two bias voltages of different directions and/or magnitudes are applied to the two electrically isolated substrate regions, according to one embodiment of the present invention.

FIG. 8 shows a SOI substrate 10 that comprises, from the bottom to top, a base semiconductor layer 12, a first insulator layer 18, a first semiconductor layer 17, a second insulator layer 14, and a second semiconductor layer 16 (i.e., the semiconductor device layer). The first semiconductor layer 17 comprises at least two substrate regions 15 that are electrically isolated from each other. Such electrically isolated substrate regions 15 function as the respective device substrates for CMOS circuits 1 and 2, thereby allowing application of substrate bias voltages of different directions and/or different magnitudes. For example, a first substrate bias voltage ($V_{SB1}>0$) can be applied by a first voltage applicator (not shown) to CMOS circuit 1, and a second substrate bias voltage ($V_{SB2}<0$) can be applied by a second voltage applicator (not shown) to CMOS circuit 2. The first and second substrate bias voltages can have either the same or different magnitudes (i.e., $|V_{SB1}|=|V_{SB2}|$ or $|V_{SB1}|\neq|V_{SB2}|$). Alternatively, the first and second substrate bias voltage can have the same direction but different magnitudes.

The specific substrate bias voltages applied to the CMOS circuits can be automatically controlled by a feedback control circuitry coupled with the respective voltage applicator. The feedback control circuitry measures the time delay through a series of inverter stages (i.e., a delay chain), and the output of the feedback control circuitry drives the substrate bias voltage until a minimum delay is achieved.

The SOI-CMOS devices of the present invention can be fabricated by any suitable method well known in the art, with minimal or no modifications that can be readily determined by a person ordinarily skilled in the art.

While FIGS. 5-8 illustratively demonstrates exemplary SOI-CMOS structures, according to specific embodiments of the present invention, it is clear that a person ordinarily skilled in the art can readily modify the device structure and the process steps illustrated herein, for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for balancing threshold voltages of a complementary metal-oxide-semiconductor (CMOS) circuit on a semiconductor-on-insulator (SOI substrate, wherein said CMOS circuit comprises an n-channel field effect transistor (n-FET) and a p-channel field effect transistor (p-FET), said method comprising:
fabricating said CMOS circuit on said SOI substrate, wherein said SOI substrate includes:
a semiconductor device layer containing source and drain regions of each of said n-FET and said p-FET;
a second buried insulator layer vertically abutting said semiconductor device layer;
a substrate region vertically abutting said second buried insulator layer and underlying said n-FET and said p-FET of said CMOS circuit; wherein said second buried insulator layer electrically isolates said semiconductor device layer from said substrate region;
a first buried insulator layer vertically abutting said substrate region;
a base semiconductor layer having a doping of a first conductivity type and located directly beneath said first buried insulator layer; wherein said first buried insulator layer electrically isolates said substrate region from said base semiconductor layer; and
applying a substrate bias voltage to said substrate region, wherein a threshold voltage of said p-FET and a threshold voltage of said n-FET are impacted by said substrate voltage bias, and wherein a difference between said threshold voltage of said n-FET and said threshold voltage of said p-FET is reduced by at least 5%.

2. The method of claim 1 wherein said n-FET and said p-FET comprise metallic gate electrodes.

3. The method of claim 1 wherein said n-FET comprises an n-doped polysilicon gate electrode, and said p-FET comprises a p-doped polysilicon gate electrode.

4. The method of claim 1, wherein one of said n-FET and said p-FET comprises a doped polysilicon gate electrode, and wherein the other of said n-FET and said p-FET comprises a metallic gate electrode.

5. The method of claim 1, further comprising controlling said substrate bias voltage with a feedback control circuitry that is coupled with a voltage applicator, wherein said feedback control circuitry measures a time delay through a series of inverter stages, and an output of said feedback control circuitry drives said substrate bias voltage until a minimum delay is achieved.

* * * * *